United States Patent [19]

Flanner et al.

[11] Patent Number: 4,822,749
[45] Date of Patent: Apr. 18, 1989

[54] SELF-ALIGNED METALLIZATION FOR SEMICONDUCTOR DEVICE AND PROCESS USING SELECTIVELY DEPOSITED TUNGSTEN

[75] Inventors: Janet M. Flanner, Union City, Calif.; Paulus Z. A. van der Putte, Eindhoven, Netherlands

[73] Assignee: North American Philips Corporation, Signetics Division, Sunnyvale, Calif.

[21] Appl. No.: 90,301

[22] Filed: Aug. 27, 1987

[51] Int. Cl.<sup>4</sup> .......................................... H01L 21/283
[52] U.S. Cl. ....................................... 437/41; 437/192; 437/193; 437/194; 437/200; 357/59
[58] Field of Search .................. 437/41, 192, 195, 200, 437/228, 984; 148/DIG. 19, DIG. 26, DIG. 147, DIG. 141; 357/2, 59 I

[56] References Cited

U.S. PATENT DOCUMENTS

| 3,881,242 | 11/1973 | Dormer | 437/192 |
| 4,445,266 | 8/1981 | Mai et al. | 437/192 |
| 4,589,196 | 10/1984 | Anderson | 148/DIG. 19 |
| 4,630,357 | 8/1985 | Rogers et al. | 437/200 |
| 4,643,777 | 12/1984 | Maeda | 437/200 |
| 4,660,276 | 8/1985 | Hsu | 437/200 |
| 4,751,198 | 9/1985 | Anderson | 437/200 |
| 4,764,484 | 10/1987 | Mo | 437/192 |

FOREIGN PATENT DOCUMENTS

| 0240123 | 11/1985 | Japan | 148/DIG. 19 |
| 0245256 | 12/1985 | Japan | 148/DIG. 19 |
| 0010258 | 1/1986 | Japan | 437/984 |

Primary Examiner—Brian E. Hearn
Assistant Examiner—Tuan Nguyen
Attorney, Agent, or Firm—John C. Fox

[57] ABSTRACT

A self-aligned metallization for an MOS device is described in which a first layer of tungsten is selectively deposited on the exposed silicon surfaces of the device including at least the source, drain and gate regions of the device, a layer of material providing nucleation sites for tungsten is selectively formed across insulating oxide regions of the device, and a second tungsten layer is selectively deposited on the nucleating layer and the exposed first tungsten layer to provide interconnection across the oxide regions. In addition to having a low electrical resistivity, such a metallization enables relaxed mask alignment and etching tolerance requirements, and is therefore useful in VLSI circuits.

12 Claims, 2 Drawing Sheets

SELF-ALIGNED METALLIZATION FOR SEMICONDUCTOR DEVICE AND PROCESS USING SELECTIVELY DEPOSITED TUNGSTEN

BACKGROUND OF THE INVENTION

This invention relates to semiconductor devices having self-aligned metallization to the exposed silicon regions of the device, and to a process for forming such metallization by the selective deposition of tungsten.

The continuing trend toward decreased size and increased packing density of integrated circuit devices demands increasing sophistication in the design and fabrication of these devices and circuits.

In VLSI (very large scale integration) circuits, mask alignment and etching tolerance requirements of conventional fabrication techniques has limited the packing density of both active devices and interconnect lines. The development of self-aligned contacts to the source, drain and polysilicon gate and interconnect lines in MOS (metal oxide semiconductor) devices has thus allowed increased packing densities of the devices and interconnects.

Self-aligned contacts are those in which enlarged contact areas are provided to allow for non-critical alignment tolerance, without increasing the device size.

One approach to the achievement of self-aligned contacts for MOS devices is to combine polysilicon contact (PC) and gate (G) masks to define the self-aligned contacts. See M. K. Kahn et al "A Self-Aligned Contact (SAC) Process For Manufacturing VLSI Circuits", 1979 ECS Meeting, Los Angeles, CA., Abstract No. 548, page 1469.

Another approach to the achievement of self-aligned contacts is to form a polysilicon layer directly on the source, drain and gate regions of the MOS device, and then form isolations in this polysilicon layer by the selective oxidation of the layer using a non-critical silicon nitride mask. H. S. Fu et al, "A New MOS Transistor With Self-Registering Source-Drain and Gate Contacts", IEDM, 1980, page 140.

Another limitation encountered in the design of VLSI circuits is the electrical resistance of the polysilicon gates and interconnects. It is known to lower the electrical resistivity of these structures by the partial or total replacement of polysilicon by metal silicides. See, for example, B. Crowder et al, "One Micrometer MOSFET VLSI Technology: Part VII-Metal Silicide Interconnection Technology-A Future Perspective", IEEE Journal of Solid State Circuits, SC-14, No. 2, April 1979, page 291. The ability to selectively form silicides on single crystal silicon and polysilicon has been employed to form low resistivity refractory metal silicide interconnects self-aligned to the source, drain and gate regions of MOS devices. C. K. Lau et al, "Titanium Disilicide Self-Aligned Source/Drain+Gate Technology", IEDM, 1982, page 714.

In a refinement of the above technique, silicide was additionally extended over the field oxide region by forming an amorphous silicon layer on the refractory metal layer over the insulating field oxide region, using a non-critical photomasking step to form the silicon layer, prior to formation of the silicide by reaction of the refractory metal in contact with the silicon. The resultant extension of the silicide interconnect over the field oxide region, allows source and drain contacts to be located adjacent to the source and drain regions rather than directly over them, enabling a relaxation of mask alignment and etching tolerance requirements. D. C. Chen et al, "A New Device Interconnect Scheme For Sub-Micron VLSI", IEDM, 1984, page 118.

However, the above-described technique requires additional steps of deposition, masking and etching to form the amorphous silicon pattern, heating to form the silicide, and etching to remove the unreacted refractory metal after silicide formation. In addition, since the silicide is not effective to prevent cross-diffusion between subsequently formed aluminum contacts and the underlying silicon, a separate layer of a barrier material such as titanium nitride or tungsten must be formed on the silicide interconnect layer in any via holes which extend beyond the edge of the field oxide into an island region of the device.

Accordingly, it is an object of the invention to provide a self-aligned metallization for a semiconductor device which has lower electrical resistivity than the polysilicon and silicide interconnects of the prior art.

It is another object of the invention to provide such a self-aligned metallization over the insulating regions of the device without the necessity for forming a silicide and without an additional etching step to remove unreacted refractory metal from the surface of the insulating regions.

It is still another object of the invention to provide such a self-aligned metallization which does not require the formation of an additional diffusion barrier layer over the metallization in those contact areas which extend beyond the edge of the insulating regions into an island region of the device.

SUMMARY OF THE INVENTION

In accordance with the invention, a self-aligned metallization for semiconductor devices is provided by selectively depositing a first layer of tungsten on the exposed semiconductive regions of the device, forming a layer of a material providing nucleating sites for tungsten on selected areas of insulating regions adjacent the silicon regions, and then selectively depositing a second layer of tungsten on the exposed portions of the first layer and the nucleating layer, whereby the metallization is extended across the insulating areas. Such a self-aligned metallization, in addition to being readily selectively deposited directly on nucleating surfaces such as single crystal, polycrystalline and amorphous silicon, has lower resistivity than polysilicon and most refractory metal silicide metallizations, and is an effective barrier to cross-diffusion between aluminum contacts and underlying silicon areas.

In accordance with one aspect of the invention, there is provided a method for forming a self-aligned metallization to the exposed silicon regions of a semiconductor device, the method comprising the steps of:

a. selectively depositing a first layer of tungsten on the exposed silicon regions of the device, the regions separated by insulating regions, b. depositing a layer of a material providing nucleating sites for tungsten on the surface of the device over at least the first selectively deposited tungsten layer and the insulating regions, c. selectively removing portions of the nucleating layer to leave a pattern overlying predetermined portions of the insulating regions and contacting at least edge portions of the first tungsten layer abutting these insulating regions, and d. selectively depositing a second layer of tungsten on the nucleating layer and the exposed portions of the first tungsten layer, to interconnect the metallization across the predetermined insulating regions.

In accordance with preferred embodiments of the invention, the nucleating layer and the second tungsten layer are deposited at a temperature below the temperature of formation of tungsten silicide, and the nucleating layer is amorphous silicon and is selectively removed by etching through a non-critical photomask.

In accordance with another aspect of the invention, there is provided a semiconductor device having exposed silicon regions, the regions separated by insulating regions, and a self-aligned metallization, the device comprising:

a. a first layer of tungsten in contact with the exposed silicon regions, b. a patterned layer of a material capable of providing nucleating sites for the selective deposition of tungsten overlying predetermined portions of the insulating regions and contacting at least edge portions of the first tungsten layer abutting these insulating regions, and c. a second layer of tungsten on the patterned nucleating layer and the exposed portion of the first tungsten layer, the second layer interconnecting the metallization across the predetermined portions of the insulating regions.

In accordance with a preferred embodiment of the device, the nucleating layer is amorphous silicon and the thickness of the first and second tungsten layers is at least about 100 nm.

BRIEF DESCRIPTION OF THE DRAWING

The invention will now be described in terms of a limited number of preferred embodiments in connection with the drawing in which.

DESCRIPTION OF THE PREFERRED EMBODIMENTS

Figure 1:
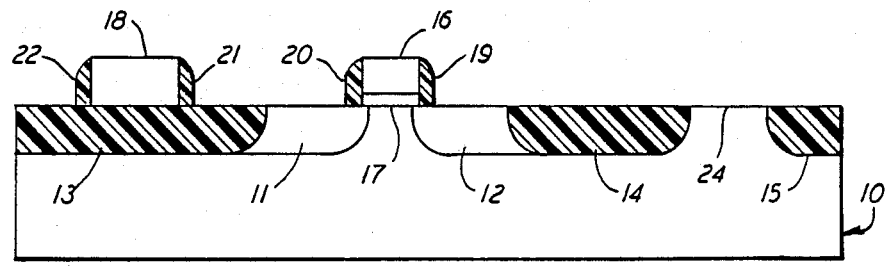
FIGS. 1 through 6 are diagrammatic cross-sections through one embodiment of an MOS device having source, drain, gate and insulating oxide regions, illustrating the sequential steps involved in the fabrication of an MOS semiconductor device of the invention.

Referring now to FIG. 1, there is shown a body of single crystal silicon 10, having already formed therein source and drain regions 11 and 12 and field oxide regions 13, 14, and 15, the source and drain regions formed by ion implantation through a thin thermally grown silicon dioxide layer, not shown, on the surface of silicon body 10. Polysilicon gate 16, on top of gate oxide 17, and polysilicon element 18 on top of field oxide 13 are located on the surface of silicon body 10, both polysilicon gate 16 and element 18 protected by oxide sidewall spacers 19, 20, 21 and 22. As is known, the spacers may be formed typically either by high pressure oxidation or chemical vapor deposition of a silicon dioxide layer on the surface of the device, followed by anisotropic reactive ion etching to selectively remove portions of the oxide layer.

Figure 2:
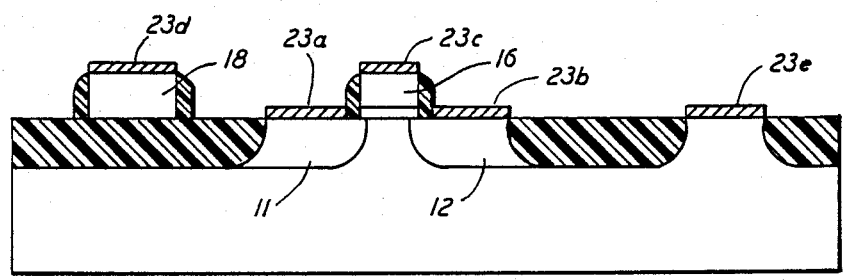

Referring now to FIG. 2, after formation of the polysilicon elements, the source, drain, and oxide sidewall spacers, a layer 23 of tungsten is selectively deposited on the exposed single crystal and polycrystalline silicon surfaces, the portions 23a, b, c, d, and e of the tungsten layer corresponding to the source 11, drain 12, gate 16, element 18 and silicon region 24 of the device. As is known, such selective deposition of tungsten on silicon surfaces may be achieved under controlled conditions as more fully described for example in E. K. Broadbent et al. "Selective Low Pressure Chemical Vapor Deposition of Tungsten", Journal of the Electrochemical Society, Vol. 131, No. 6, June 1984, page 1427. Briefly, such selective deposition may be achieved by bringing the device surface into contact with a vapor of a reducible tungsten compound such as $WF_6$ in the presence of $H_2$, at a temperature within the range of about 250° to 500° C. Deposition initially occurs when the $WF_6$ is reduced to metallic tungsten upon coming into contact with the exposed silicon surfaces of the device, and then subsequently by the reduction of $WF_6$ by $H_2$.

This tungsten layer, which provides a low resistivity contact to the silicon, should be thick enough to prevent the underlying silicon of the source and drain regions from being etched during the etching step to be described below, a layer thickness of about 100 nm in general being sufficient to prevent such undesired etching. The sheet resistance of such a layer is on the order of 1 ohm per square, versus a sheet resistance of a refractory metal silicide layer of comparable thickness of from about 1 to 10 ohms per square.

Figure 3:
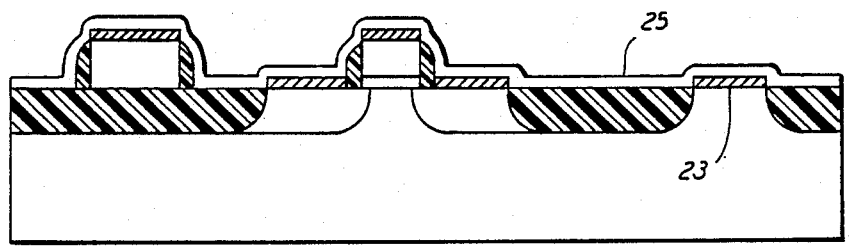

Referring now to FIG. 3, after the formation of the first tungsten layer 23, a layer 25 of amorphous silicon or other material which can act as a sourc of nucleation sites for tungsten is deposited. In addition to acting as a nucleation site for tungsten, the material should be capable of being deposited below 500° C., which is approaching the temperature of formation of tungsten silicide, and of being etched selectively with respect to tungsten and silicon dioxide. As may be seen, the amorphous silicon layer 25, formed for example by sputtering, covers the entire surface of the device.

Figure 4:
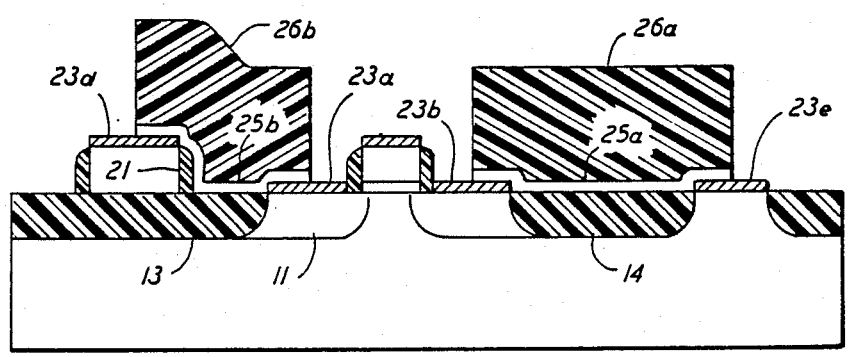

Referring now to FIG. 4, the amorphous silicon layer 25 is next formed into a pattern of areas 25a and 25b, by applying a photoresist layer on the surface of the deposited silicon layer 25, and patterning the photoresist layer 26a and 26b to mask field oxide 14 and abutting portions of tungsten layers 23b and 23e, as well as sidewall spacer 21, a portion of field oxide 13 between spacer 21 and source region 11, and abutting portions of tungsten layers 23a and 23d. Silicon layer 25 is then etched to leave patterned areas 25a and 25b. During this etching, tungsten layer 23 protects the underlying silicon from attack by the etchant.

Figure 5:
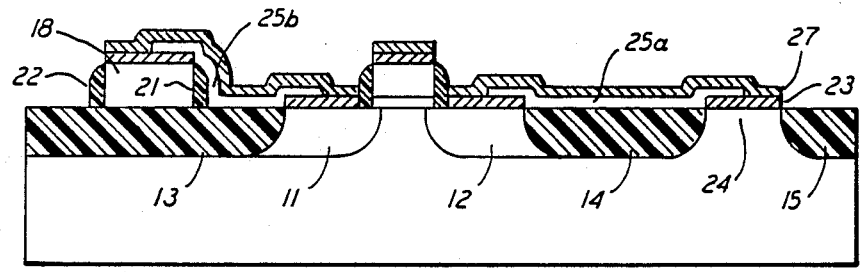

Photoresist pattern elements 26a and 26b are then stripped away, and a second tungsten layer 27 is selectively deposited on the amorphous silicon patterned areas 25a and 25b, as well as on the exposed portions of the first tungsten layer, as shown in FIG. 5. Thus, amorphous silicon areas 25a and 25b have provided nucleation sites for the second deposited layer of tungsten 27, whereby the resulting metallization extends from source region 11 across field oxide 13 and sidewall spacer 21 to polysilicon element 18, and from drain region 12 across field oxide 14 to channel region 24. In addition, due to the selectivity of the tungsten deposition, sidewall spacer 22, field oxide region 13 adjacent sidewall spacer 22 and field oxide region 15 remain free of tungsten throughout the process, thereby avoiding the need for a selective etching step to remove tungsten from these regions.

The second tungsten layer is deposited to a thickness of at least about 100 nm and preferably about 120 nm, in order to provide a reliable low resistivity interconnect structure.

Figure 6:
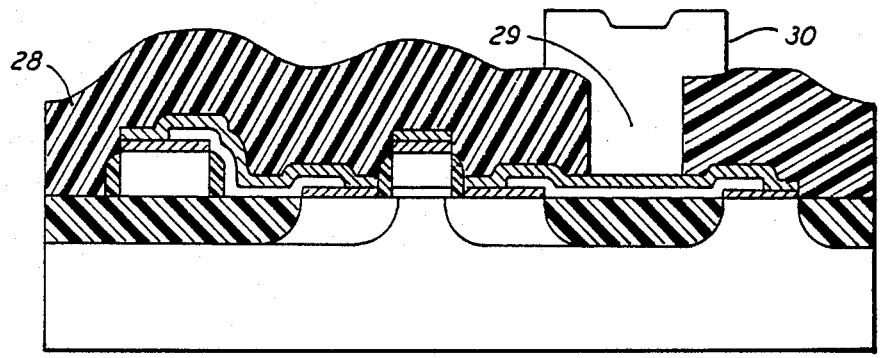

Following completion of the self-aligned metallization structure, the entire surface of the device is encapsulated in a thick insulating oxide layer 28, as shown in FIG. 6. This layer 28 is typically a plasma or vapor deposited dielectric layer, which is preferred because it can be formed at a temperature below 500° C., which is approaching the temperature of formation of tungsten silicide. Thus, "flow" glass, which is highly phosphorous-doped silicon dioxide having a high flow temperature, cannot be used in this embodiment.

Planarization of the oxide layer 28 may be carried out if desired by one of the known techniques such as applying a layer of liquid photoresist over the uneven surface, allowing the photoresist to solidify, and then back etching the planar surface by a physical method, such as sputter etching or ion milling, to remove the photoresist and the underlying material at about the same rate. See, for example, U.S. Pat. No. 4,025,411.

Next, contact or via hole 29 is opened in oxide layer 28 by etching, and external contact to the metallization is provided by a metal such as aluminum or an aluminum alloy having a small percentage of silicon, or a similar suitable contact material, and the device is then finished in accordance with conventional procedures.

Figure 7:
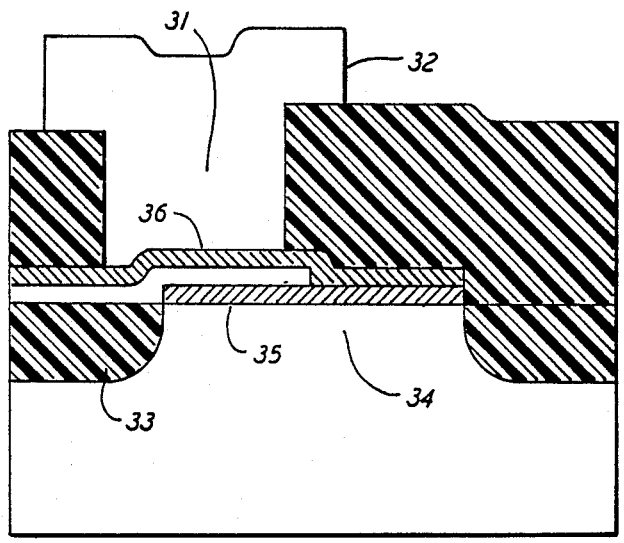
FIG. 7 is a diagrammatic section view of another embodiment of an MOS device of the invention, in which an aluminum contact area extends beyond the edge of a field oxid region.

One of the advantages of the self-aligned metallization structure of the invention is that the tungsten layers in the metallization structure can act as an effective barrier to diffusion between the aluminum contact 30 and the underlying silicon. For example, FIG. 7 shows a variation of the device in which the via hole 31 is located at the edge of field oxide region 33, and therefore overlaps silicon region 34 of the device. In this arrangement, tungsten layers 35 and 36 of the metallization structure act as barriers to the cross-diffusion of species between silicon region 34 and the aluminum contact 32.

In general, the formation of tungsten silicide by reaction of the tungsten layers with either the underlying single crystal silicon body or the overlying amorphous silicon layer, is to be avoided due to the higher resistivity of the silicide. However, there may be applications in which the formation of the silicide is desired. In such applications, polysilicon, which has a deposition temperature greater than 500° C., may be substituted for amorphous silicon, and silicide would be formed during deposition by reaction with the underlying tungsten layer. In the alternative, the silicide could be formed by a separate anneal above 500° C. to promote reaction between the amorphous silicon and the first tungsten layer. Subsequently, the amorphous or polysilicon would be removed from the unmasked portions of the layer by an etchant which is selective for the silicon relative to the silicon dioxide and tungsten silicide. The second tungsten layer could then be deposited in the manner described above, (the tungsten disilicide and amorphous or polysilicon providing nucleation sites for selective deposition), at a temperature below 500° C. in order to retain the benefits of lower resistivity and barrier to diffusion of this layer.

We claim:

1. A method for forming a self-aligned metallization to exposed semiconductor regions of a semiconductor device, the method comprising the steps of:
   (a) selectively depositing a first layer of tungsten on the exposed semiconductor regions of the surface of the device, these regions separated by insulating regions,
   (b) depositing a nucleating layer of a material providing nucleating sites for tungsten on the surface of the device over the first selectively deposited tungsten layer,
   (c) selectively removing portions of the nucleating layer to leave a pattern of areas overlying predetermined portions of the insulating regions and contacting at least edge portions of the first tungsten layer abutting these insulating regions, and
   (d) selectively depositing a second layer of tungsten on the remaining areas of the nucleating layer and the exposed portions of the first tungsten layer, in order to interconnect the metallization across the predetermined insulating regions.

2. The method of claim 1 in which the metallization process is carried out at temperatures below about 500° C.

3. The method of claim 1 in which the nucleating layer pattern overlaps the edge portions of the abutting first tungsten layer.

4. The method of claim 1 in which the nucleating layer is selectively removed by forming a layer of photoresist on the surface of the device, selectively removing portions of the photoresist to leave a pattern corresponding to the desired pattern of the nucleating layer, selectively etching the exposed portions of the nucleating layer, and stripping the photoresist pattern to leave the desired nucleating layer pattern.

5. The method of claim 1 in which the nucleating layer is amorphous silicon.

6. The method of claim 1 in which the thickness of the first and second tungsten layers is at least 100 nm.

7. The method of claim 1 in which following the selective deposition of the second tungsten layer, a thick insulating layer is formed on the surface of the device, at least one contact hole is opened through the insulating layer, and at least one contact is formed through the hole to the underlying metallization.

8. The method of claim 7 in which the thick insulating layer is planarized.

9. The method of claim 7 in which the contact is selected from aluminum and its alloys.

10. The method of claim 1 in which the device is an MOS device and the exposed semiconductor regions include at least source, drain and gate regions.

11. The method of claim 10 in which the semiconductor is silicon.

12. The method of claim 10 in which the insulating regions are oxide.

* * * * *